(12) United States Patent
Pelissier et al.

(10) Patent No.: US 7,848,384 B2
(45) Date of Patent: Dec. 7, 2010

(54) DEVICE AND METHOD FOR ULTRAWIDEBAND RECEPTION USING A SUPER-REGENERATIVE DETECTOR

(75) Inventors: Michael Pelissier, Grenoble (FR); Dominique Morche, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 791 days.

(21) Appl. No.: 11/681,065

(22) Filed: Mar. 1, 2007

(65) Prior Publication Data
US 2007/0217482 A1 Sep. 20, 2007

(30) Foreign Application Priority Data
Mar. 3, 2006 (FR) .................. 06 01945

(51) Int. Cl.
*H04B 1/00* (2006.01)
(52) U.S. Cl. .............. 375/130; 375/260; 375/367; 701/200; 701/226
(58) Field of Classification Search ........... 375/130
See application file for complete search history.

(56) References Cited

U.S. PATENT DOCUMENTS

| | | | |
|---|---|---|---|
| 3,329,952 A | | 7/1967 | Bogle |
| 3,813,599 A | * | 5/1974 | Campbell ............ 324/76.13 |
| 4,393,514 A | | 7/1983 | Minakuchi et al. |
| 4,749,964 A | | 6/1988 | Ash |
| 5,146,613 A | * | 9/1992 | Anderson ............ 455/78 |
| 5,901,172 A | | 5/1999 | Fontana et al. |
| 6,118,567 A | * | 9/2000 | Alameh et al. ........... 398/191 |
| 7,359,449 B2 | * | 4/2008 | Feher ............ 375/279 |
| 7,398,068 B2 | * | 7/2008 | Javor et al. ........... 455/140 |
| 7,590,401 B1 | * | 9/2009 | Frazier ............ 455/334 |
| 2002/0173341 A1 | * | 11/2002 | Abdelmonem et al. ...... 455/561 |
| 2003/0099299 A1 | * | 5/2003 | Rogerson et al. ............ 375/253 |
| 2004/0136438 A1 | * | 7/2004 | Fullerton et al. ............ 375/130 |
| 2004/0224654 A1 | * | 11/2004 | Javor et al. ............ 455/146 |
| 2005/0046503 A1 | * | 3/2005 | Nakahi et al. ............ 331/151 |
| 2005/0107692 A1 | * | 5/2005 | Li et al. ............ 600/430 |
| 2005/0141602 A1 | * | 6/2005 | Hyun et al. ............ 375/219 |
| 2005/0226348 A1 | * | 10/2005 | Jurgensen et al. ........... 375/303 |

(Continued)

FOREIGN PATENT DOCUMENTS

EP 1 655 853 A1 11/2004

(Continued)

OTHER PUBLICATIONS

Armstrong, Edwin H., "Some Recent Developments of Regenerative Circuits," presented before The Institute of Radio Engineers, New York, NY, Jun. 7, 1922.

(Continued)

*Primary Examiner*—Chieh M Fan
*Assistant Examiner*—Santiago Garcia
(74) *Attorney, Agent, or Firm*—Brinks Hofer Gilson & Lione

(57) ABSTRACT

Receiver and reception method of receiving pulsed ultrawideband radio-frequency signals employ an amplification phase, an oscillation phase sensitive to an instability control signal, a shaping phase, and a demodulation phase, and further including an adaptation control step for adapting the receiver or the reception method to the type of signals to be received.

42 Claims, 6 Drawing Sheets

U.S. PATENT DOCUMENTS

| | | | |
|---|---|---|---|
| 2005/0227627 A1* | 10/2005 | Cyr et al. | 455/67.11 |
| 2005/0232371 A1* | 10/2005 | Rogerson et al. | 375/295 |
| 2006/0052124 A1* | 3/2006 | Pottenger et al. | 455/515 |
| 2006/0072646 A1* | 4/2006 | Feher | 375/130 |
| 2006/0072647 A1* | 4/2006 | Feher | 375/130 |
| 2006/0183455 A1* | 8/2006 | Cha et al. | 455/323 |
| 2006/0270449 A1* | 11/2006 | Kim et al. | 455/552.1 |
| 2007/0081613 A1* | 4/2007 | Kim et al. | 375/327 |
| 2007/0133720 A1* | 6/2007 | Rivaz et al. | 375/343 |
| 2007/0147475 A1* | 6/2007 | Yamamoto | 375/130 |
| 2007/0147476 A1* | 6/2007 | Merz et al. | 375/130 |
| 2007/0147477 A1* | 6/2007 | Cavallaro et al. | 375/130 |
| 2007/0217482 A1* | 9/2007 | Pelissier et al. | 375/130 |
| 2008/0036506 A1* | 2/2008 | Lam et al. | 327/45 |
| 2008/0043818 A1* | 2/2008 | Tal et al. | 375/135 |
| 2008/0051129 A1* | 2/2008 | Abe et al. | 455/550.1 |
| 2008/0232506 A1* | 9/2008 | Fujita et al. | 375/295 |
| 2009/0079524 A1* | 3/2009 | Cyr et al. | 334/78 |
| 2009/0141781 A1* | 6/2009 | Azenkot et al. | 375/219 |

FOREIGN PATENT DOCUMENTS

| | | |
|---|---|---|
| WO | WO 01/76086 A2 | 3/2001 |
| WO | WO 03/009482 A1 | 7/2002 |

OTHER PUBLICATIONS

Whitehead, J. R., "Super Regenerative Receivers," Table of Contents, Cambridge at the University Press, 1950.

J. R. Whitehead "*Super-Regenerative Receivers*"—Cambridge At The University Press 1950—pp. 22-63 (24 pages).

* cited by examiner

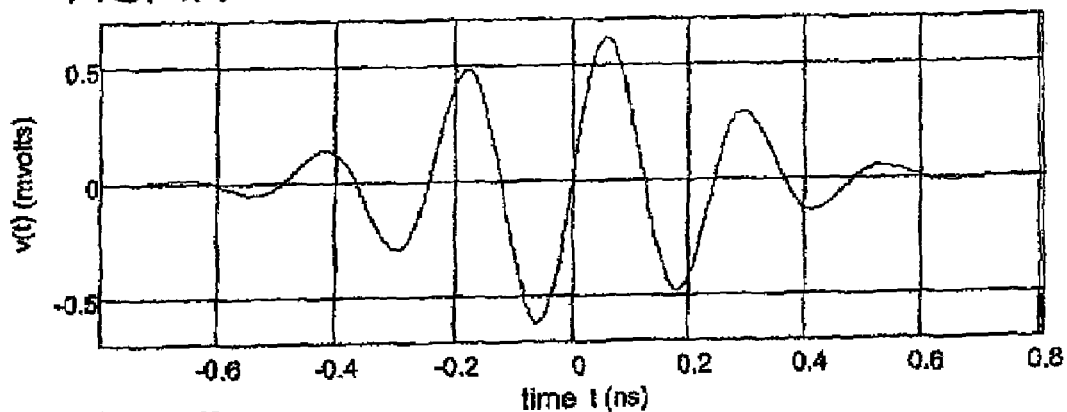
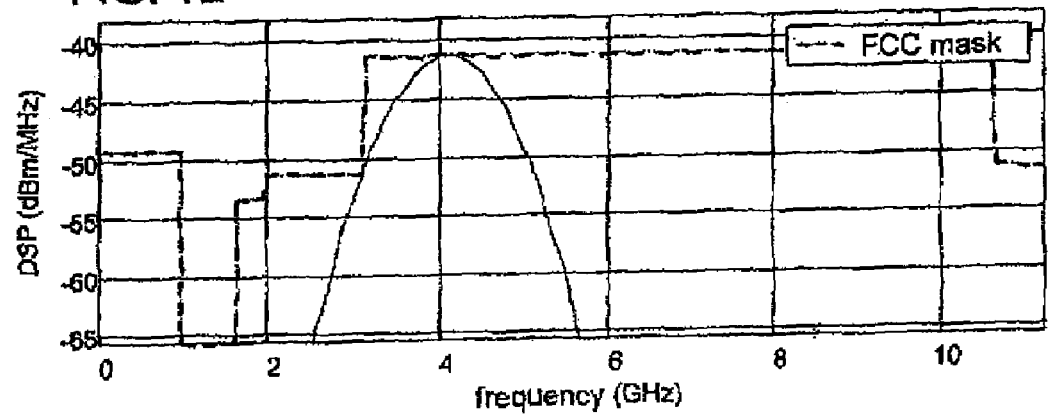
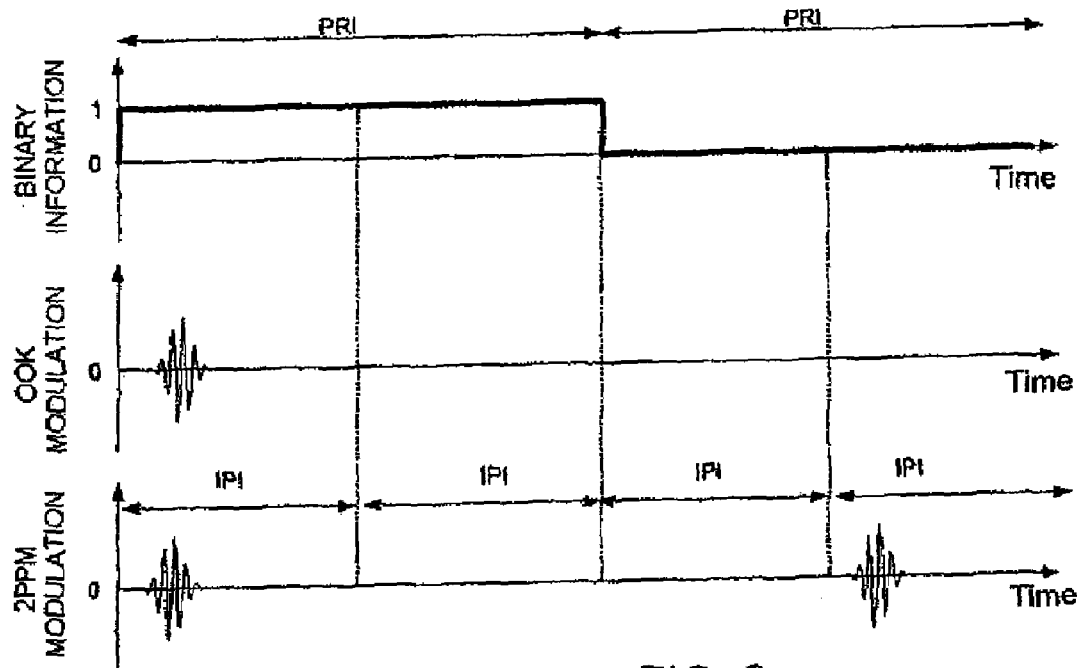
FIG. 2

DEVICE AND METHOD FOR ULTRAWIDEBAND RECEPTION USING A SUPER-REGENERATIVE DETECTOR

PRIORITY CLAIM

This application claims priority to French patent application no. 06/01945 filed Mar. 3, 2006, the disclosure of which is incorporated by reference herein.

TECHNICAL FIELD

The present invention relates to a device and a method for ultrawideband reception using a super-regenerative detector. More particularly, the present invention concerns a receiver of radio-frequency waves (the term "radio-frequency" is abbreviated "RF" through the remainder hereof) employing the UWB (ultrawideband) technology, and a corresponding reception method. The invention belongs to the field of pulsed mode UWB communications. The invention may advantageously be used in low-consumption applications.

BACKGROUND

The technique of UWB communication in pulsed mode consists in transmitting pulses of short duration (of the order of one nanosecond). The pulsed signals concerned have a bandwidth of several gigahertz. Information may be coded via the level or the amplitude of these pulses (for example by pulse amplitude modulation (PAM)) and/or via the position in time of these pulses (pulse position modulation (PPM)).

A signal v(t) of the type considered in the context of the impulse mode UWB communication technique may generally be expressed in the time domain as the product of a sinusoid portion with center frequency $f_c$ by a temporal window w(t), that is to say, in analytical form:

$$v(t) = \sin(2\pi f_c \times t) \times w(t)$$

The temporal windowing governs the shape of the spectrum and a rectangular, triangular or Gaussian gate may be used for the window w(t). In the latter case:

$$w(t) = \exp\left[-\left(\frac{t}{\tau}\right)^2\right]$$

where $\tau$ characterizes the temporal length of the pulse.

The center frequency $f_c$ is typically made equal to 4.1 GHz and the pulse width $\tau$ typically has the value 342 ps, which corresponds to a −10 dB spectral occupancy of 2 GHz. The graphs in FIGS. 1A and 1B show the form of such a signal in the time domain and in the frequency domain, respectively.

In FIG. 1A, time t (in nanoseconds) is plotted on the abscissa axis and the curve represents the level of the signal v(t) in volts. In FIG. 1B, frequency (in GHz) is plotted on the abscissa axis and the spectral power density (DSP) (in dBm/MHz) is plotted on the ordinate axis. The signal is transmitted with a frequency transmission mask as authorized by the FCC (Federal Communications Commission). The signal is represented in solid lines and the FCC mask is represented in dashed lines.

To transmit information, as mentioned above, several types of modulation may be used, in particular modulation by level or modulation by position in time. For example, there may be used a form of modulation by level of the all or nothing modulation type (OOK, On-Off Keying; for simplicity, in the remainder of the description, the expression "OOK modulation" is used) or a form of modulation by position in time of the N-pulse position modulation type (N-PPM, N representing the number of nominal positions; in the remainder of the description, for simplicity, the expressions "PPM modulation" and "N-PPM modulation" are used).

The three timing diagrams in FIG. 2 give a diagrammatic temporal representation of these two types of modulation.

In OOK modulation (see the center timing diagram in the drawing), a pulse is sent when the logic level has the value 1 and nothing is sent when it has the value 0. The pulse repetition interval (PRI in the drawing) here corresponds to the binary timing. This interval may be divided into two impulse position intervals (IPI in the drawing).

In PPM modulation (see the bottom timing diagram in the drawing: the case of 2-PPM modulation is illustrated by way of nonlimiting example), if the information has the value 1, the pulse is sent in the first interval, and if the information has the value 0, the pulse is sent in the second interval.

The UWB telecommunication sector has gained a new relevance in recent years. In particular, solutions have been proposed for providing high bit rate communications, but these architectures cannot address the new expectations in this field in terms of low consumption and low cost.

A solution of the "rake receiver" type is known from published PCT application No. WO-A-01 76086. The receiver described in that document uses an analog mixer to establish a correlation between the received signal and an elementary pulse pattern generated in the receiver. This solution concentrates on a finite number of collected paths. Each finger or path on which the receiver concentrates requires an active mixer, increasing the complexity and the consumption of the device.

Another solution consists in sampling the UWB signal and establishing a correlation with a digital reference pattern, in order to demodulate the signal. This correlation pattern takes into account the complete impulse response of the channel, in contrast to the previous solution. Nevertheless, this solution is relatively complex to implement: because of the high bandwidth and the high center frequency, fast sampling is required in order to comply with the Nyquist criterion, necessitating a high frequency synthesis and producing a voluminous stream of digital data. All these operations, which are costly in energy, are effected to the detriment of the overall consumption of the receiver.

Solutions are emerging for reducing the complexity of the reception architecture, but they still have major drawbacks:

A first of these solutions is based on detecting pulse peaks. There are two techniques for implementing this solution.

The first technique corresponds to a comparator type threshold detector. This solution necessitates high amplification of the received signals because the sensitivity of such detectors is generally relatively low. Consumption is then governed by the stages with gain.

A second technique known from U.S. Pat. No. 5,901,172 corresponds to the use of a tunnel-effect diode: the diode is biased to the peak voltage in the vicinity of the negative slope zone of instability. If the level of the signal is sufficient, it triggers the tunnel effect in the diode and the operating point switches into the "valley" zone of the characteristic of the diode, thus enabling the presence of a pulse to be detected. A drawback of this solution is the drifting of the bias point of the diode as a function of temperature and power supply fluctuations, which degrades the sensitivity of the receiver. Solutions exist that attempt to remove this drawback, for example by placing signal attenuators for adjusting the bias point, but these compensation solutions are hardly effective in terms of energy consumption.

Another solution consists in working with energy detection architectures. These architectures lump together all of the energy recovered in the propagation channel. This operation necessitates the rectification of the UWB signal before integrating the result over an integration window corresponding to the spreading of the channel. However, the very low levels of the received signals (of the order of magnitude of a few tens of microvolts) generally mean that this operation cannot be effected without proceeding beforehand to significant amplification. This amplification requires a high consumption, which limits the benefit of such a solution. Moreover, the fact of lumping together all of the energy rules out exploiting the excellent temporal resolution offered by UWB.

Thus the prior art cited above does not address the need for an architecture and a process for receiving ultrawideband signals that are simple to implement, enable the development of receivers having a low consumption, and can respond to location and communication requirements.

The RF reception architecture based on super-regenerative devices was described for the first time in 1922 by E. H. ARMSTRONG in a paper entitled "Some recent developments of regenerative circuits", in Proc. IRE, vol. 10, August 1922, pages 244 to 260. The principle of the super-regenerator is as follows: at the heart of the device there is an oscillator placed at the limit of instability. When the signal arrives, the additional energy it contributes triggers the oscillator, which begins to oscillate. If there is only noise at the input of the device, starting is effected much more slowly, making it possible to distinguish between the situation in which a signal is present and the situation in which there is only noise. The general theory of using this device for the reception of RF signals is described in a specialist work by J. R. WHITEHEAD entitled "Super-Regenerative Receivers" published by Cambridge University Press in 1950.

This architecture has the advantage of providing quasi-infinite amplification at low power consumption. It found applications in the 1950s in the field of pulsed radar, where the level of the reflected signals to be processed was very low. On this subject see U.S. Pat. No. 3,329,952 applied for in 1957 and granted in 1967.

The implementation options of that time render the production of such low-voltage integrated micro-electronic technology devices difficult at present, however.

Moreover, in the applications considered at the time, the signals propagated in free space, whereas the environments currently envisaged in UWB applications are very different and very varied, and necessitate a particular adaptation of the reception architecture and of the corresponding reception process.

The super-regenerator has been used in recent years to demodulate a narrowband signal rather than an ultrawideband signal, with or without spectrum spreading. On this subject see published PCT application No. WO-A-03 009482. An advantage of this solution lies in its low cost of implementation and its low consumption, justifying its use in remote control type applications, for example. In this solution, demodulation is effected by direct conversion of the RF signal into the baseband. The current trend in narrowband applications is to use high-Q resonators of the surface acoustic wave (SAW) type to improve the selectivity of the super-regenerative architecture. Such a device is described in U.S. Pat. No. 4,749,964.

Despite all this, when applied to narrowband communications the super-regenerator has a major drawback, namely a bandwidth that is too large compared to the band of the modulated signal. This makes communication vulnerable because it is sensitive to nearby sources of interference and to accumulated in-band noise.

It is for this reason that frequency-transposition-based homodyne or heterodyne architectures have been preferred when the major constraint is not consumption.

On the other hand, in the UWB context, the drawback cited above may in contrast prove to be a beneficial advantage, in that, as indicated in the introduction, the band of the signal occupies several GHz. A receiver with a high bandwidth is therefore required to obtain good detection performance.

Furthermore, because of the inherent operation of the super-regenerator, the circuit does not recover all of the energy that is transmitted on a sinusoidal carrier, for example; it is sensitive to only a portion of that energy, corresponding to the phase in which the oscillator is at the limit of instability. Thus the super-regenerator inherently samples the input signal. This property is particularly well adapted to UWB signals in that the energy is concentrated over the time period in which the UWB pulse is transmitted. Finally, in the narrowband field, unlike UWB, a tuning difference between the resonant frequency of the super-regenerator and the carrier frequency of the signal degrades the sensitivity of the device. Production constraints therefore apply to narrowband devices that are not relevant when a spread spectrum is used for excitation.

Accordingly, and contradicting perceived wisdom in the art, despite the frequency selectivity of the oscillatory device of a super-regenerator, the latter is, at constant average power, more efficient in a UWB system than in a narrowband system.

SUMMARY

In particular, the present invention aims to associate the super-regenerative architecture with the demodulation of UWB signals and to use that architecture to provide in particular for location between two communication means, for example a receiver and a transmitter.

With this aim, the present invention proposes a device for receiving pulsed UWB (ultrawideband) radio-frequency signals, including amplification means, oscillation means responsive to an instability control signal, shaping means, demodulation means, this reception device being noteworthy in that it further includes control means for adaptation to the type of signals to be received.

The UWB receiver according to the invention therefore has a low energy consumption and a low complexity of implementation, at the same time as having a very high bandwidth.

In one particular embodiment, the control means for adapting the reception device to the type of signals to be received include means for optimization of the control of the instability control signal of the oscillation means.

Matching the instability control signal of the receiver to the type of signals to be detected optimizes the bandwidth of the receiver as a function of the signal in order to maximize the ratio between the level of the wanted signal and the noise.

In this particular embodiment, according to one particular feature, the adaptation control means use a predetermined form of damping control signal to supply an analytical expression of the type of signals received.

In one particular embodiment with a multipath environment, i.e. in which the signals are received from multiple paths, the reception device may include means for weighting each of these paths.

In such an embodiment, according to one particular feature, the reception device may further include delay means for applying to each of the paths a predetermined delay.

According to one particular feature, the damping control signal is different for each of the paths.

According to one particular feature, the signals may be modulated in accordance with an all or nothing form of modulation (OOK, On-Off Keying).

Alternatively, the signals may be modulated in accordance with N-pulse position modulation (N-PPM), where N is a predetermined integer.

The reception device conforming to the present invention finds many particularly advantageous uses.

For example, it may be used for communication purposes, as a reception device as such or as part of a transmission/reception device. By way of nonlimiting example, such a device may be included in a radio device, in the context of communication with one or more appropriate transmission or transmission/reception devices, for example contained wholly or in part in one or more radio devices.

Accordingly, the present invention also proposes communication means including oscillation means responsive to an instability control signal, this communication means being noteworthy in that they further include control means for adapting the above reception device to the type of signals to be received.

The present invention further proposes a transmission/reception device including oscillation means responsive to an instability control signal, this transmission/reception device being noteworthy in that it further includes control means for adapting the above reception device to the type of signals to be received.

The present invention also proposes a transmission/reception device noteworthy in that it includes the above reception device.

This receiver is moreover capable of achieving a very high temporal resolution, thereby exploiting the nature of the UWB signals, with a view to adding the location function to the receiver.

It may therefore be used with equal advantage for locating one or more radio devices, in particular from one or more other radio devices, the location function being optionally associated with the communication function, according to the requirements of the application concerned.

Accordingly, the present invention also proposes a device for location of communication means by other communication means, these communication means including time measuring means, voltage-time conversion means and oscillation means responsive to an instability control signal, this location device being noteworthy in that it further includes control means for adapting the above reception device to the type of signals to be received.

The present invention also proposes a device for location of communication means by other communication means, these communication means including time measuring means, voltage-time conversion means and oscillation means responsive to an instability control signal, this location device being noteworthy in that it includes the above reception device.

In one particular embodiment, the location device includes means for estimation of distance by calculation of the round trip time.

This makes it possible to obtain good temporal resolution and thus to exploit the inherent nature of the signals to be processed.

Moreover, and still in the context of minimizing electrical energy consumption, the reception device conforming to the present invention may also be used with advantage for automatically starting, restarting or activating a radio device in a standby state. In particular this reduces the consumption of the receiver in the standby state.

Accordingly, the present invention proposes a device for activating a radio device, including oscillation means responsive to an instability control signal, this activating device being noteworthy in that it further includes control means for adapting the above reception device to the type of signals to be received.

The present invention proposes a device for activating a radio device, noteworthy in that it includes the above reception device.

In the same way as it proposes a reception device, the present invention equally proposes a method of reception of pulsed UWB (ultrawideband) radio-frequency signals, including an amplification step, a step of oscillation conditioned by an instability control step, a shaping step, a demodulation step, this method being noteworthy in that the oscillation step is additionally effected as a function of a control step of adapting the reception method to the type of signals to be received.

The particular characteristics and the advantages of this method are similar to those detailed hereinabove with regard to the reception device and are therefore not repeated here.

The invention likewise proposes a method of activating a radio device, including a step of oscillation conditioned by an instability control step, this activating method being noteworthy in that it further includes a control step of adapting the above reception method to the type of signals to be received.

The invention also proposes a method of activating a radio device noteworthy in that it includes steps of the above reception method.

The invention also proposes a method of location of communication means by other communication means, these communication means including time measuring means, voltage-time conversion means and oscillation means responsive to an instability control signal, this location method being noteworthy in that it further includes a control step of adapting the above reception method to the type of signals to be received.

The invention also proposes a method of location of communication means by other communication means, these communication means including time measuring means, voltage-time conversion means and oscillation means responsive to an instability control signal, this location method being noteworthy in that it includes steps of the above reception method.

The invention also proposes a transmission/reception method including a step of oscillation conditioned by an instability control step, this transmission/reception method being noteworthy in that it further includes a control step of adapting the above reception method to the type of signals to be received.

The invention also proposes a transmission/reception method noteworthy in that it includes steps of the above reception method.

The invention also proposes a method of processing signals noteworthy in that it executes steps of the above reception method.

The invention also proposes a device for processing signals noteworthy in that it includes the above reception device and/or the above location device.

The invention also proposes a roaming device noteworthy in that it includes the above reception device and/or the above location device.

The invention also proposes a mobile telephone noteworthy in that it includes the above reception device and/or the above location device.

The invention also proposes a multimedia device noteworthy in that it includes the above reception device and/or the above location device.

These methods and devices have particular characteristics and advantages similar to those already mentioned for the reception device.

Other aspects and advantages of the invention will appear on reading the following detailed description of particular embodiments, given by way of nonlimiting example.

BRIEF DESCRIPTION OF THE DRAWING

The description refers to the drawings that accompany it, in which:

FIGS. 1A and 1B represent respectively in the time domain and in the frequency domain, the form of a signal of the type considered in the context of the present invention, in one particular embodiment;

FIG. 2 shows diagrammatically two types of modulation routinely used in the field of UWB communications;

DETAILED DESCRIPTION

As indicated above, starting in particular from the observation that current UWB receivers cannot have a very low electrical consumption and that signals sent on a sinusoidal carrier cannot exploit fully the capacities of super-regenerative architectures, the invention utilizes a super-regenerator for the reception and the demodulation of UWB signals.

Figure 3:
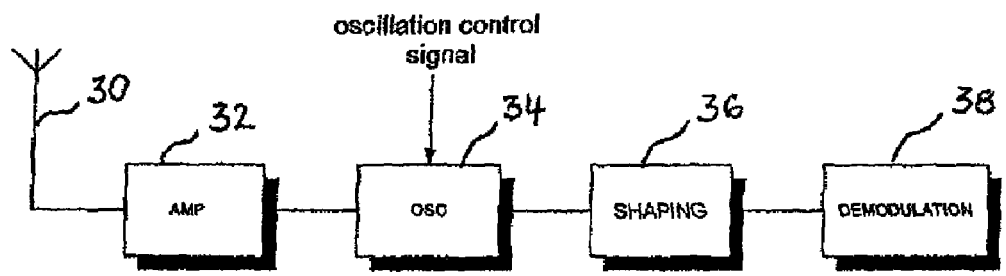
FIG. 3 represents diagrammatically the general architecture of a UWB demodulator using a super-regenerator, of the type used by the present invention, in one particular embodiment.

The FIG. 3 block diagram shows the general architecture of a reception device with UWB demodulator based on a super-regenerator, conforming to the present invention, in one particular embodiment.

This super-regenerative reception device comprises an oscillator 34, the instability and damping phases whereof are controlled by means of a periodic control signal: the damping signal. This control signal, which may come from the outside or be generated as a function of the output of the receiver, optimizes the sensitivity of the receiver with respect to the signal to be detected. In conformance with the present invention, it is further attempted to optimize the control signal vis-à-vis the UWB signal to be detected. More particularly, the sensitivity function of the receiver may be adapted to the received UWB pulse, since it has the same Gaussian shape. When the oscillator is placed at the limit of instability and receives the additional energy of a UWB pulse, the oscillations begin and diverge until the damping control signal extinguishes them.

At the output of the oscillator 34 there is a signal shaping stage 36. This stage primarily effects a conversion into the baseband of the oscillatory signal at the center frequency of the oscillator.

Behind the shaping stage 36 is a demodulation unit 38 for extracting information. In fact, when there is no signal (which situation may be associated, for example, with the "0" logic level in the case of OOK modulation), the oscillator starts up less quickly, because it receives less energy. The demodulator makes the decision between the situation in which there is a signal (logic level "1") and the situation in which there is only noise (logic level "0").

Finally, on the upstream side of the oscillator 34 there is an antenna 30 which converts radiated electromagnetic energy into electrical energy usable in the reception circuit. An amplifier 32 limits the overall noise level of the reception subsystem and isolates the oscillatory signal from the antenna 30 to prevent any radiation from the receiver. The bandwidth of the amplifier 32 is high but its gain may be limited, in that the amplifier is followed by the super-regenerator, also providing gain.

The oscillator used at the heart of the super-regenerator is an active system operating at only one frequency: its inherent oscillation frequency. Because of this, the oscillator is all the more sensitive to an exciting signal when it is excited by a signal beating at the same frequency. It is this basic principle that has enabled massive use of the super-regenerator in narrowband applications, for which the energy of the exciter signal is concentrated around a carrier frequency corresponding to the inherent oscillation frequency. A particularly advantageous aspect of the invention consists in proposing an optimization of the system so that, despite the inherent frequency selectivity of the oscillator, the super-regenerator detects a pulsed signal occupying a very wide frequency spectrum.

In UWB reception devices, the two most critical units in terms of consumption are the amplification system and the frequency synthesizer.

In fact, UWB signals typically occupy more than 2 GHz of bandwidth. To amplify such signals significantly, it is necessary to use an amplifier with a high value of the product of the gain and the bandwidth, leading to high consumption of energy by the corresponding stage. In the reception architecture conforming to the present invention, the gain is virtually infinite, without this generating any greater consumption, as this gain is provided by an unstable device. Furthermore, the bandwidth of the device is an effective instantaneous bandwidth governed by a control signal. The super-regenerator therefore has a high bandwidth only at decision times, thus enabling consumption to be reduced.

A typical UWB signal considered in the context of the present invention under discussion is centered around about 4 GHz. To reconstitute the shape of the signal, it is necessary, in traditional solutions, to effect a conversion into the baseband using a mixer, an oscillator or a reference signal operating at such frequencies. Another prior art solution consists in direct sampling at a frequency higher than around 10 GHz. These solutions are particularly high consumers of energy at the level of the frequency synthesis. The super-regenerator avoids this danger, as it effects sampling at the information timing rate, namely at a rate of the order of a few tens of kilohertz, thereby clearly relaxing the constraints.

Finally, other prior art solutions cited above (energy detection) sample at the information timing rate to limit the consumption due to the frequency synthesis. However, these solutions, by lumping together the energy contained in the transmission channel, lose one of the major advantages of UWB: excellent intrinsic temporal resolution. Thus these solutions do not have the benefit of the accuracy required to provide the location function. In contrast, the super-regenerator, when the sensitivity function is optimized, effects detection at pulse level, thereby enabling resolutions of the order of magnitude of one nanosecond to be achieved.

Figure 4:
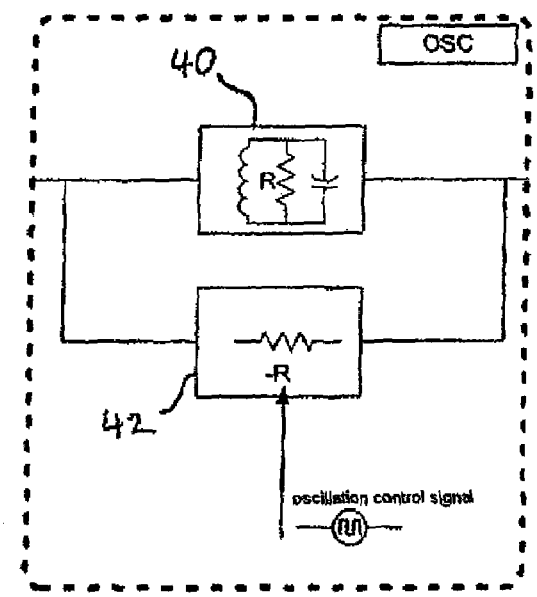
FIG. 4 represents diagrammatically an oscillator of the type used by the present invention, in one particular embodiment.

In one particular embodiment of the present invention, the reception architecture is optimized to detect a UWB pulse and to demodulate the signal. The oscillator shown in FIG. 4 is made up of an LC cell type passive resonator 40 the natural resonant frequency whereof is tuned to the center frequency of the UWB excitation signal. Given the spread spectrum of the signal, the match between these two frequencies is much less critical than in narrowband applications. To compensate the losses of this resonator, there is added in parallel an active component 42 that generates a negative resistance, so controlling the damping factor of the resulting oscillator.

With no external control input, the damping factor of the cavity of the resonator is linked to the losses of the resonator and has the value $\varsigma_0$. This factor varies if a control signal is applied. When the damping factor $\varsigma$ cancels out, the oscillator becomes unstable: it is then that the device is sensitive to the input signal. It thus samples the UWB signal and begins to oscillate. The shape of the damping control signal adjusts the bandwidth of the receiver as a function of the bandwidth of the input signal, controls the regeneration gain, controls the shape of the output signal, and adjusts the speed with which the oscillations are extinguished. In conformance with the present invention, the aim is to optimize this control signal as a function of the characteristics of the UWB signal to maximize the pulse detection capacity of the circuit. The sensitivity function s(t) of the receiver may be expressed at the time to of sampling the input signal, i.e. at the moment at which the damping factor is cancelled out on a falling edge (on this topic see the work by J. R. WHITEHEAD cited above):

$$s(t) = \exp - \left[\frac{t-t0}{\tau_S}\right]^2$$

with $$\tau_S = \sqrt{\frac{2}{-\varsigma'(t0)}}$$

It is found that the sensitivity function s(t) of the receiver is a Gaussian function of time, centered on the sampling time. The sensitivity function is matched to the input signal when the parameter $\tau_s$ of this Gaussian function is matched to the parameter $\tau$ of the Gaussian function of the envelope of the UWB signal defined in the introduction (see window w(t)).

To increase the bandwidth of the receiver and achieve a value of $\tau_s$ of 342 ps, a high derivative with respect to is therefore required. A sawtooth or sinusoidal control signal is typically used. The solution therefore consists in increasing the frequency or the amplitude of the control signal. Now, the amplitude of the control signal is directly linked to the consumption of the negative resistance. To envisage a low-consumption receiver, it is preferable to work on the frequency. However, too high a frequency leads to excessively fast sampling of the input signal. Accordingly, the oscillations of the preceding sampling cycle risk not having had the time to be extinguished before a new cycle begins, especially in the case of low-loss passive resonators having a high Q and therefore a low damping factor. The FIG. 5 timing diagrams show one possible embodiment in this context.

Figure 5:
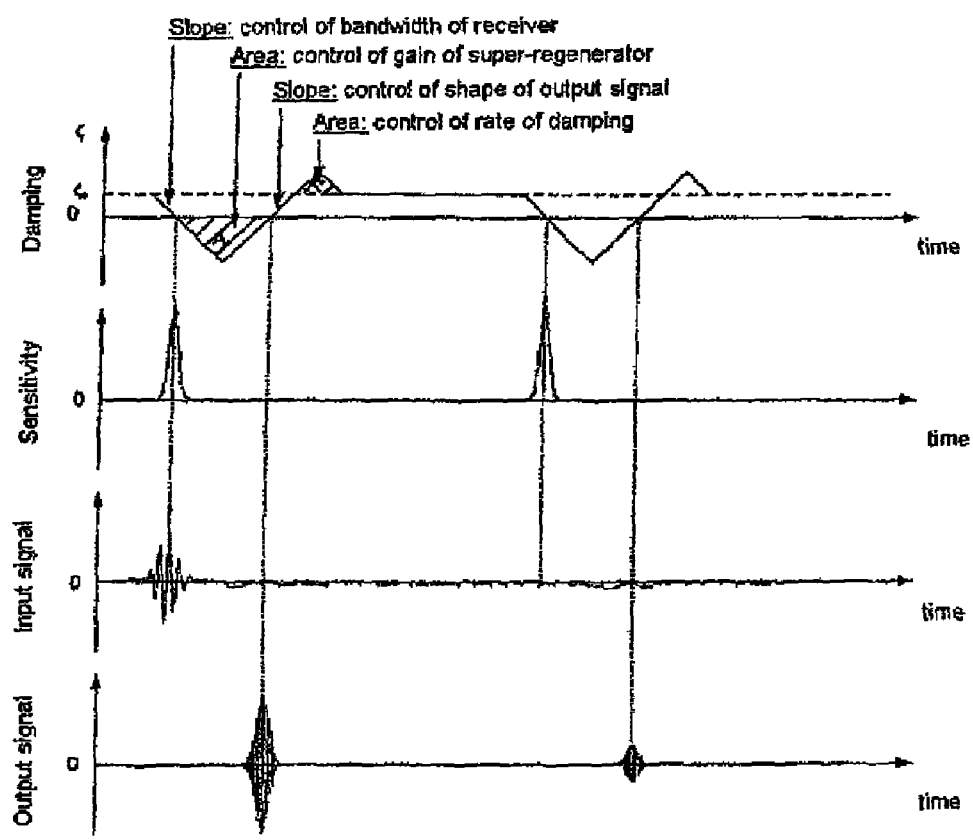
FIG. 5 shows timing diagrams of signals operative around an oscillator such as that from FIG. 4, in one particular embodiment.

As shown in FIG. 5, a relatively widely used triangular control signal is chosen, for example, which is optimized relative to the UWB signal concerned. The timing diagrams show two respective sampling phases of the UWB signal and the noise. It is found that when the pulse is present, the output signal of the oscillator has a higher amplitude than when it is triggered only by noise. Optimizing the control of damping entails four adjustments of the control signal:

1) the negative slope provides a sensitivity function adapted to the pulse. It is optimized to have $\tau_s=\tau$;

2) the negative area A− is linked to the super-regenerative gain generated by the instability of the oscillator. It is optimized so that the device provides sufficient gain for the shaping stage, behind the oscillator (see FIG. 3 described above) to be able to work with signals having a significant level (typically of the order of a hundred mV);

3) the positive slope controls the shape of the output signal. If the slope is identical, in terms of absolute value, to the negative slope, there is found at the output a signal of the same shape as at the input, amplified relative to the input signal;

4) the positive area A+ forces the extinction of the oscillations in the situation where the damping inherent to the resonator is insufficient to extinguish the oscillations. This parameter is important when a relatively fast control signal is used.

Figure 6:
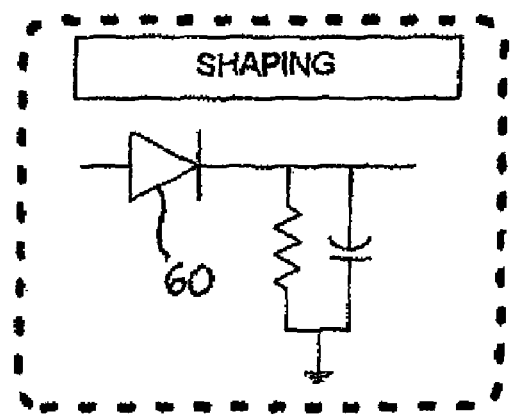
FIG. 6 shows diagrammatically a shaping stage of the type used by the present invention, in one particular embodiment.

The shaping stage may be a threshold detector or an envelope detector. The embodiment using an envelope detector is particularly advantageous since it enables working in both modes of operation of the super-regenerator (linear and logarithmic). The envelope detector converts the high-frequency signal at the oscillator output into a baseband signal at low cost. It may be implemented by half-wave rectification (as shown in FIG. 6) or by full-wave rectification followed by a low-pass filter stage, for example. This choice is made possible by the fact that the signals to be processed have significant amplitudes, enabling the non-linear characteristic of the diode 60 to be exploited (see FIG. 6).

Figure 7A:
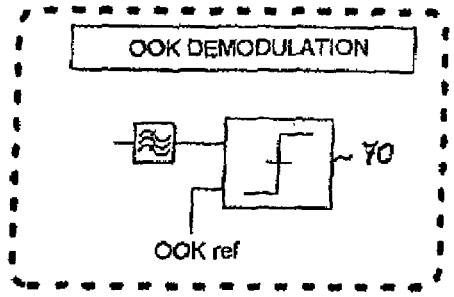
FIGS. 7A and 7B represent diagrammatically a demodulation unit of the type used by the present invention, in two respective particular embodiments.

Finally, behind the shaping stage, there is the UWB signal demodulation unit. Two embodiments may be envisaged according to the type of modulation (FIGS. 7A and 7B).

In both cases there is an integrator filter 70 that takes the mean value of the rectified signal. In the case of OOK modulation (FIG. 7A), this value is compared to a reference value synchronously with the symbol timing. This reference level corresponds to the situation where the super-regenerator takes a noise sample. The reference level is estimated in a training phase, the object of which is to define this reference threshold, in order to optimize the false alarm rate and the probability of missing a pulse.

Figure 7B:
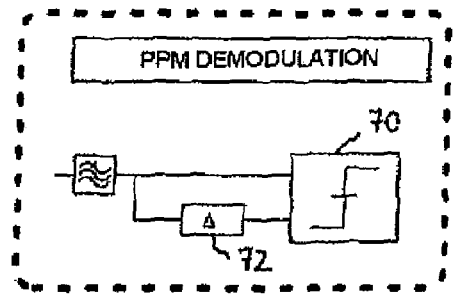

This training phase may be costly in energy and another, preferable embodiment uses PPM modulation (FIG. 7B). The principle of the demodulator then consists in continuously comparing the mean value calculated over a symbol half-period relative to the adjacent symbol half-period. According to whether the output switches one way or the other, it may be determined whether the information was transmitted in the first time interval or the second. To compare the two levels, the output of the integrator may be digitized. This solution may be costly if good resolution of levels is required. The preferred solution consists in introducing a delay element 72 that provides the information of rank n and n−1 in continuous time. This delay is adjusted to the value of a symbol half-period. The signal at its input being a low-frequency signal, implementing this delay causes no major problem. Unlike OOK modulation, PPM modulation provides an estimate of the noise level in continuous time.

The embodiment described above applies more particularly in direct visibility propagation environments, in which the receiver picks up the dominant direct path from the transmitter. In more complex environments, the receiver receives not only the direct path but also a collection of paths caused by multiple reflections and diffractions. The expressions "multiple paths" and "multipath environment" are used. In this type of environment, the energy picked up is spread out in time.

It is possible to use the solution described above but in this case only a fraction of the total energy is recovered, since a pulse corresponding to a single path is concentrated on. The output signal-to-noise ratio is therefore sub-optimal.

The invention aims to propose an improvement to the single-path super-regenerator to take account of the temporal diversity introduced by the impulse response of the transmission channel. In this other embodiment, N sampling control signals are sent to harvest the energy of the N majority paths. In contrast to solutions of the type described in the patent document WO-A-01 76086 mentioned in the introduction, which necessitate for this a more complex receiver with duplication of the architecture, the implementation proposed by the present invention is simple: the reception of the N paths is effected by controlling the frequency of occurrence of the damping control signal.

Figure 8:
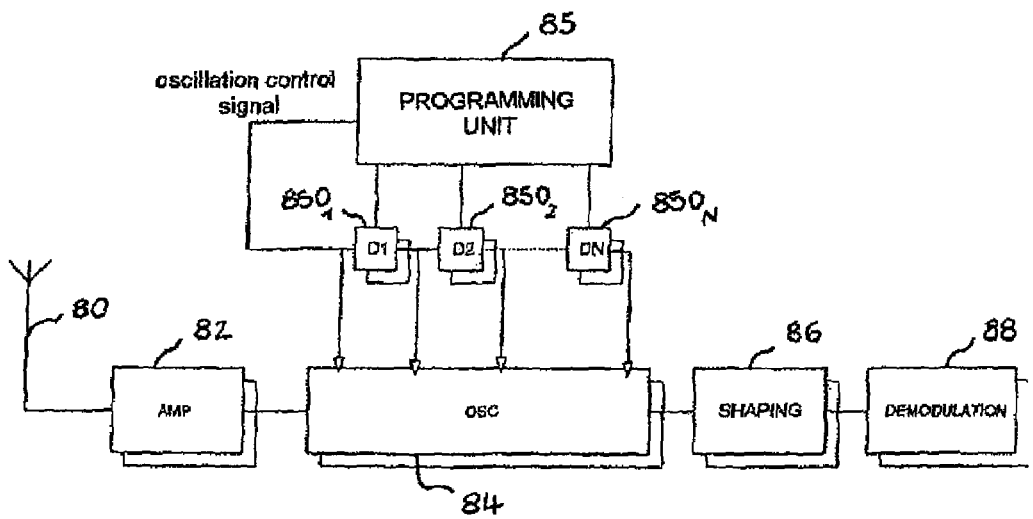
FIG. 8 represents diagrammatically the general architecture of a UWB demodulator using a super-regenerator, of the type used by the present invention, in one particular embodiment for an environment with multipath propagation channels.

To this end there is introduced a battery of delay cells $850_1$, $850_2$, ..., $850_N$ (D1, D2, ..., DN in FIG. 8) for adjusting the time of the sampling control signals to the N meaningful times of the collected composite response. These delays are controlled in the digital domain by a programming unit 85 that is reinitialized for each new channel estimation phase. At the output of the oscillator 84, the shaping stage 86 and the demodulation stage 88 remain unchanged. There are also an antenna 80 and an amplification stage 82 on the upstream side of the oscillator 84. However, taking N energy samples from the signal makes the device more robust if the channel is degraded.

Figure 9:
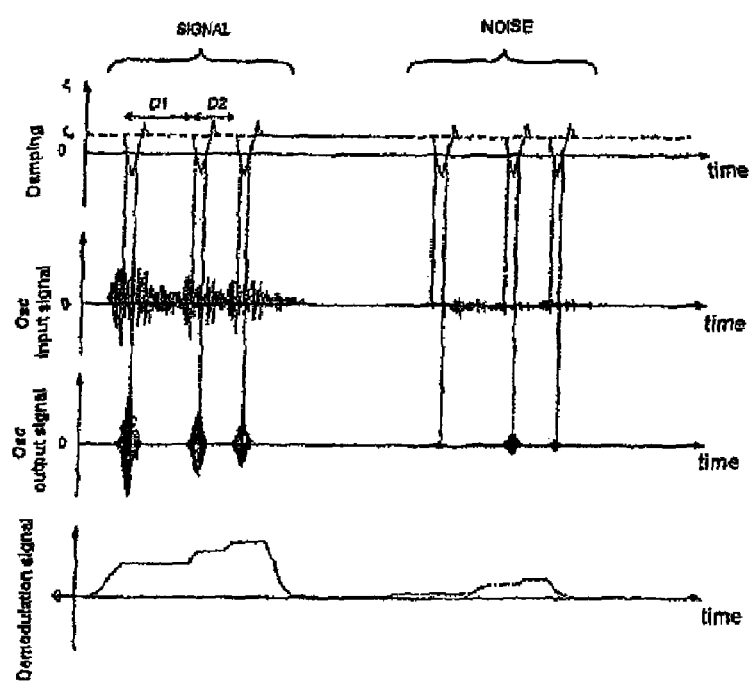
FIG. 9 shows timing diagrams of the response of an optimized super-regenerator such as that from FIG. 8, in one particular embodiment.

FIG. 9 gives timing diagrams of the response of the super-regenerator in the case of a degraded propagation channel. In the nonlimiting example shown, two delay cells are provided, for taking three meaningful samples of the composite response. In the situation where the samples are close to each other, it is possible to accelerate the damping of the output of the oscillator by increasing the area A+ defined hereinabove.

Figure 10:
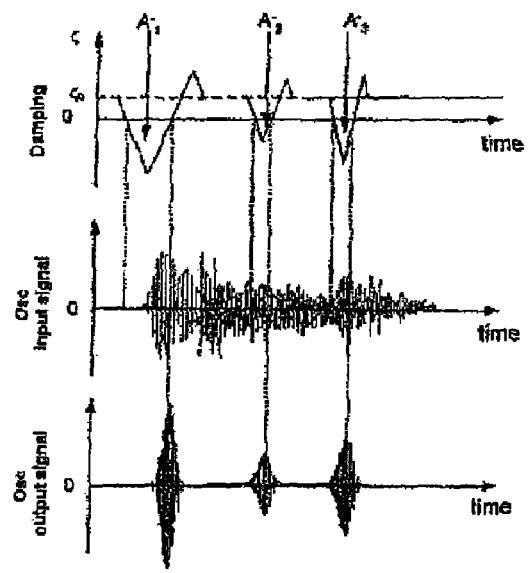
FIG. 10 shows, for one particular embodiment of the present invention, timing diagrams of the response of an optimized super-regenerator such as that from FIG. 8, in which filtering appropriate to the received signal is also effected.

Another solution derived from the preceding one may be envisaged for optimizing demodulation performance. This variant is illustrated by the FIG. 10 timing diagrams. The paths may be combined by weighting them differently. Accordingly, the stronger paths will have a higher value compared to the weaker ones in order to make the detection process reliable. Thus filtering adapted to the propagation channel is effected. At the level of the super-regenerative architecture, this implementation is made possible by varying the area A− that controls the super-regenerative gain on each path that it is wished to recover. Once the channel estimation has been done, the oscillation control signal can be generated for sampling the signal effectively.

The two new demodulation solutions proposed using a super-regenerator, namely the single-path and multipath solutions, necessitate a synchronization phase prior to the demodulation phase. This synchronization phase is indispensable to any form of radio communication and is well known to the person skilled in the art (see for example the document WO-A-01 76086 cited above). It constructs a shape of the sampling and damping control signal that is the optimum for demodulation. In other words, this phase determines, in the first case, the sampling times and, in the second case, also determines the weight to be assigned to each sample. In this synchronization phase, the receiver scrutinizes the channel to determine at which time it receives the pulse. By successively incrementing the time of triggering the sampling control signal as and when the pulse is repeated, the receiver finds the optimum time for the remainder of the communication. In the more sophisticated solution that weights each path, the synchronization phase entails digitization by means of an analog-to-digital converter of the signal at the output of the shaping stage. This digitization enables storage of the received signal and quantization of its level, so as to assign a different weight to each path of the composite response.

To consume minimum energy, radio devices can go to a standby state. In such a state, the elements of the reception subsystem consuming energy are inactive. To restart the active portion in order to perform sophisticated functions such as communication for the purposes of bidirectional exchange of information or location, an auxiliary start-up device is usually necessary. The solution proposed consists in using the super-regenerator coupled to receive a UWB excitation signal to start up the radio receiver. That radio receiver may be a super-regenerator with complex functions, as just described, or, more widely, a narrowband radio device. As in the embodiment with single-path detection described above, a single sample of the composite response of the channel is taken.

If that sample bears witness to the presence of signal in the channel, the complete receiver is started to provide the communication or other functions. To minimize unnecessary starts, an average may be obtained over a plurality of cycles to guarantee the actual presence of signal.

Figure 11:
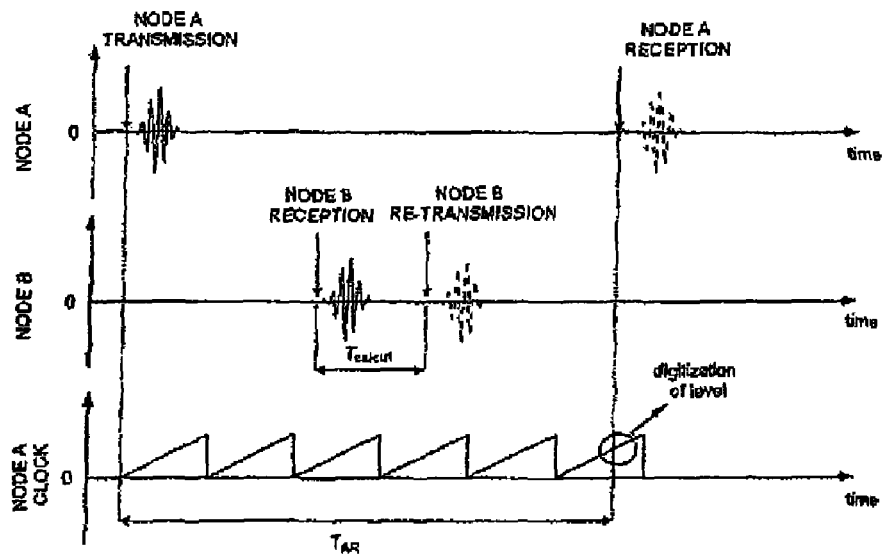
FIG. 11 shows timing diagrams for estimation of distance by the technique, known in itself, of calculating the round trip time, in one particular embodiment of the present invention in which the latter is used as a location device.

The reception device conforming to the present invention provides excellent temporal resolution since its sensitivity is adjusted to the pulse to be detected. Consequently, using the known method of estimating the round trip time, this device can locate one node from another with great accuracy. This is illustrated by the FIG. 11 timing diagrams. Typically, with a parameter τ of 342 ps, the 99% base width of the Gaussian distribution is 623 ps, providing a theoretical accuracy of better than 19 cm. The distance estimation phase necessitates a particular exchange protocol between the transmitter of a node A and the receiver of another node B (or vice versa), enabling the round trip time between the two devices to be determined. It is assumed initially that the receiver communicates with the transmitter using the demodulation method described above. When the latter enters the distance estimation phase, the receiver switches to a specific reception mode. In that mode, the same signal is sent periodically by the transmitter, and the receiver detects the first path of the composite response of the channel. In fact, the first path is a faithful and unbiased indicator of the distance between the two devices. For this purpose, the sampling control signal is advanced step by step on each new transmission, so that the receiver progressively probes the energy contained at the very start of the composite response. The level collected is compared continuously to the noise level. The process stops when the receiver is able to locate the first path: before that first path, there is only noise. When the first path is located, the distance between the node A and the node B is estimated. A standard method is to determine the time taken by the signal to effect a round trip. The node A transmits a pulse and triggers a timer. The timer is stopped when the first path of the response from the node B returns to the node A. Knowing the propagation speed, denoted c, of the wave in air, the distance information, denoted d, is obtained directly from the measured round trip time $T_{AR}$. This relatively standard technique is made possible by the intrinsic temporal accuracy of the super-regenerator. Given that the clock of the receiver is relatively slow, to limit consumption, if the return pulse arrives between two clock cycles, a voltage-time conversion device is necessary to obtain a temporal accuracy greater than the clock period. The level of the ramp is then sampled and then digitized and added to the clock cycle counter initialized at the start of the pulse from the node A. The distance d between the nodes A and B is then calculated very simply from the equation: $d=c/2\times(T_{AR}-T_{calcul})$.

Figure 12:
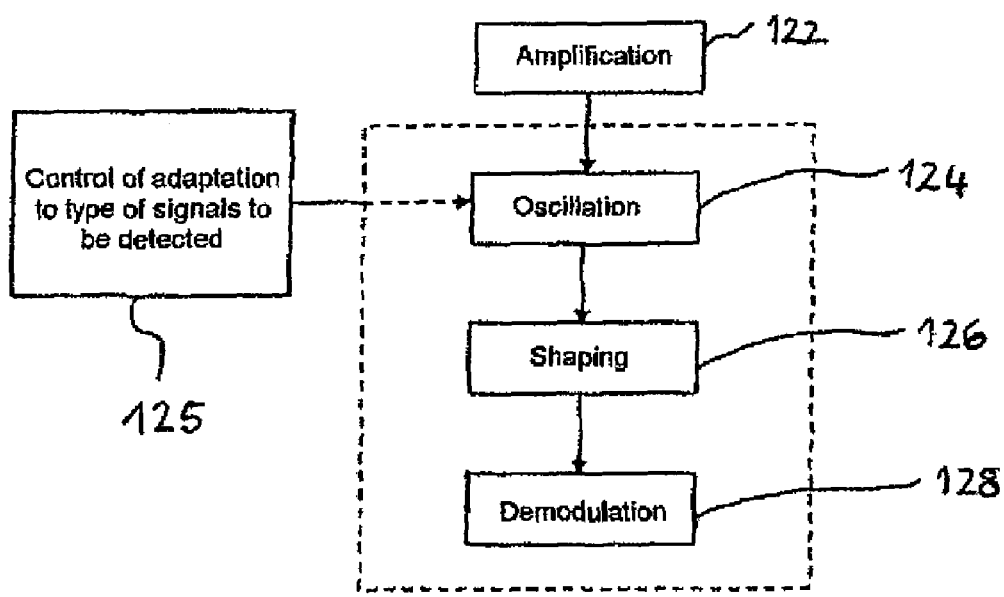
FIG. 12 is a flowchart showing the principal steps of a reception method conforming to the present invention, in one particular embodiment.

The FIG. 12 flowchart summarizes the principal steps of a reception method conforming to the present invention. Given that the successive phases of the detection process have already been described in detail hereinabove, in particular with reference to FIGS. 3 and 8, it will merely be noted here that FIG. 12 shows the amplification step 122, the oscillation step 124, the shaping step 126 and the demodulation step 128 as well as, in accordance with the present invention, the control phase 125 of adapting the reception process to the type of signals to be detected.

The invention claimed is:

1. A reception device for receiving a pulsed UWB (ultrawideband) radio-frequency signal, the device comprising:
    a super-regenerator oscillator responsive to an instability control signal, the oscillator receiving the pulsed UWB radio-frequency signal;
    shaping means coupled to demodulation means, the shaping means receiving signals output by the oscillator; and
    adaptation control means for adapting the reception device to the UWB signal to be received, wherein the adaptation control means are configured to apply the instability control signal adapted to match a sensitivity function of the receiver to the UWB signal which is received.

2. The reception device according to claim 1, wherein the adaptation control means is configured to use a predetermined form of damping control signal to supply an analytical expression of the type of signals received.

3. The reception device according to claim 2, wherein the reception device is configured to receive the pulsed UWB (ultrawideband) radio-frequency signals from multiple paths, and wherein the damping control signal comprises a different signal for each of the multiple paths.

4. The reception device according to claim 1, wherein the reception device is configured to receive the pulsed UWB (ultrawideband) radio-frequency signals from multiple paths, and wherein the reception device further comprises means for weighing each of the multiple paths.

5. The reception device according to claim 4, further comprising delay means for applying a predetermined delay to each of said paths.

6. The reception device according to claim 1, wherein the pulsed UWB (ultrawideband) radio-frequency signal is modulated by an all or nothing form of modulation (OOK, On-Off Keying).

7. The reception device according to claim 1, wherein the pulsed UWB (ultrawideband) radio-frequency signal is modulated by N-pulse position modulation (N-PPM), where N is a predetermined integer.

8. An activating device for activating a radio device, wherein the device includes a reception device according to claim 1.

9. A location device for location of communication means by other communication means, the communication means including time measuring means, and voltage-time conversion means the location device further comprising a reception device according to claim 1.

10. The location device according to claim 9 further comprising means for estimation of distance by calculation of the round trip time.

11. The location device according to claim 9, wherein the location device comprises a signal processing device.

12. The location device according to claim 9, wherein the location device comprises a roaming device.

13. The location device according to claim 9, wherein the location device comprises a mobile telephone.

14. The location device according to claim 9, wherein the location device comprises a multimedia device.

15. The reception device according to claim 1, wherein the adaptation control means is configured to apply to the oscillator the instability control signal, where the instability control signal is adapted to match a parameter $\tau_s$ of a Gaussian curve defined by the sensitivity function of the receiver to a parameter $\tau$ of a Gaussian envelope of the UWB signal which is received.

16. The reception device according to claim 1, wherein the adaptation control means is configured to apply the instability control signal, where the instability control signal has a derivative which is sufficiently high at the time that a damping factor of the oscillator cancels out on a falling edge in order to match the sensitivity function of the receiver to the UWB signal which is received.

17. The reception device according to claim 1, wherein the adaptation control means is configured to use the instability control signal, where the instability control signal has a predetermined sawtooth form.

18. The reception device according to claim 1, wherein the UWB signal to be received comprises pulses the duration of which is of the order of one nanosecond and the temporal windowing of which is defined by a Gaussian gate.

19. The device according to claim 1 further comprising amplification means coupled to the oscillator.

20. The reception device according to claim 1, wherein the reception device comprises a signal processing device.

21. The reception device according to claim 1, wherein the reception device comprises a roaming device.

22. The reception device according to claim 1, wherein the reception device comprises a mobile telephone.

23. The reception device according to claim 1, wherein the reception device comprises a multimedia device.

24. The device according to claim 1, wherein the instability control signal comprises a periodic signal.

25. A method of receiving a pulsed UWB (ultrawideband) radio-frequency signal by a receiver, the method comprising successively: an oscillation step using an oscillator responsive to an instability control signal and receiving the UWB signal; a shaping step; and a demodulation step, wherein the oscillation step is a function of an adaptation control step that adapts the reception method to the type of UWB signals to be received by applying the instability control signal adapted to match a sensitivity function of the receiver to the UWB signal that is being received.

26. The method according to claim 25, wherein the adaptation control step uses a predetermined form of damping control signal to supply an analytical expression of the type of signals received.

27. The method according to claim 26, wherein the pulsed UWB (ultrawideband) radio-frequency signal is received from multiple paths, and wherein the damping control signal is different for each of the multiple paths.

28. The method according to claim 25, wherein the pulsed UWB (ultrawideband) radio-frequency signal is received from multiple paths, and wherein the reception method further comprises a step of weighting each of the multiple paths.

29. The method according to claim 28, further comprising applying a predetermined delay to each of the multiple paths.

30. The method according to claim 25, wherein the pulsed UWB (ultrawideband) radio-frequency signal is modulated in accordance with an all or nothing form of modulation (OOK, On-Off Keying).

31. The method according to claim 1, wherein the signal is modulated in accordance with N-pulse position modulation (N-PPM), where N is a predetermined integer.

32. A method of activating a radio device, wherein the method includes a reception method according to claim 1.

33. A method of location of communication means by other communication means, the communication means including time measuring means, and voltage-time conversion means the location method comprising a reception method according to claim 25.

34. The method according to claim 33 further comprising a step of estimation of distance by calculation of the round trip time.

35. A transmission/reception method, wherein the method includes a reception method according to claim 25.

36. A signal processing method, wherein the method executes a reception method according to claim 25.

37. The method according to claim 25, wherein the adaptation control step is configured to adapt the oscillation step so as to match a parameter $\tau_s$ of a Gaussian curve defined by a sensitivity function of the receiver to a parameter $\tau$ of a Gaussian envelope of the UWB signal which is being received.

38. The method according to claim 25, wherein the adaptation control step is configured to apply to the oscillation step the instability control signal, where the instability control signal has a derivative which is sufficiently high at the time that the damping factor of the oscillator cancels out on a falling edge, in order to match the sensitivity function of the receiver to the UWB signal which is received.

39. The method according to claim 25 wherein the adaptation control step uses the instability control signal, where the instability control signal has a predetermined sawtooth form.

40. The method according to claim 25 further comprising an amplification step before the oscillation step.

41. The method according to claim 25 wherein the UWB signal to be received comprises pulses the duration of which is of the order of one nanosecond and the temporal windowing of which is defined by a Gaussian gate.

42. The method according to claim 25, wherein applying the instability control signal comprises applying a periodic signal.

* * * * *